United States Patent [19]

D'Angelo et al.

[11] 4,167,748
[45] Sep. 11, 1979

[54] HIGH VOLTAGE MONOLITHIC TRANSISTOR CIRCUIT

[75] Inventors: Robert S. D'Angelo, Summit; Adrian R. Hartman, Westfield; Peter W. Shackle, Bridgewater, all of N.J.

[73] Assignee: Bell Telephone Laboratories, Incorporated, Murray Hill, N.J.

[21] Appl. No.: 921,229

[22] Filed: Jul. 3, 1978

[51] Int. Cl.² .......................................... H01L 27/02
[52] U.S. Cl. ...................................... 357/46; 357/13; 357/30; 357/51; 357/68
[58] Field of Search ....................... 357/13, 30, 46, 51, 357/68

[56] References Cited

U.S. PATENT DOCUMENTS

| | | |
|---|---|---|
| 3,177,414 | 4/1965 | Kurosawa et al. ................... 357/40 |
| 3,596,150 | 7/1971 | Berthold et al. ..................... 357/46 |
| 3,755,722 | 8/1973 | Harland et al. ..................... 357/46 |
| 3,995,308 | 11/1976 | Weinstein ............................. 357/46 |
| 4,071,852 | 1/1978 | Kannam ............................... 357/13 |
| 4,078,244 | 3/1978 | Bonis .................................... 357/46 |
| 4,081,817 | 3/1978 | Hara ..................................... 357/23 |

Primary Examiner—Edward J. Wojciechowicz
Attorney, Agent, or Firm—Lester H. Birnbaum

[57] ABSTRACT

Disclosed is a monolithic transistor circuit for high voltage applications. A high impedance bleed resistor is effectively provided across the emitter-base junction of one of the transistors. This is accomplished by placing the base regions of this and another transistor at a selected distance apart so that the zero bias depletion regions of the bases overlap to produce a punch through condition resulting in a desired current density therebetween when an external bias is supplied. The devices thus produced have a high current carrying capacity with low leakage currents.

12 Claims, 4 Drawing Figures

HIGH VOLTAGE MONOLITHIC TRANSISTOR CIRCUIT

BACKGROUND OF THE INVENTION

This invention relates to monolithic transistor circuits, and in particular to providing a large value resistance across the emitter-base junction of a transistor in said circuit.

There are many presently available circuits employing at least two stages of current amplification. For example, Darlington circuits are well known for use as amplifiers and switches. Such circuits employ two transistors which are cascaded by connecting the emitter of the input transistor to the base of the output transistor and interconnecting the collectors. It is most advantageous to fabricate such a circuit as a monolithic device where the transistors are formed in a single semiconductor wafer with a common collector region. Various structures of this type have been proposed (see, for example, U.S. Pat. Nos. 3,177,414 issued to Kurosawa, 3,596,150 issued to Berthold, 3,755,722 issued to Harland, Jr., and 3,995,308 issued to Weinstein). The primary advantage of such circuits is the resulting gain, which is the product of the gains of the individual transistors.

One of the inherent problems associated with such a circuit is the presence of leakage currents across the collector-base junction of the input transistor which tend to turn on the transistor when no input information is supplied. Due to the coupling of the transistors, this leakage current is amplified in the second transistor. The usual approach to this problem is to provide resistors across the emitter-base junctions of the transistors in order to bleed off the leakage current. Such conventional bleed resistors are effective for most device applications.

For high voltage devices, however, it is often not practical to produce elements of sufficient resistance on a small discrete chip. For example, a Darlington switch with a phototransistor as the input and operating at approximately 300 volts can produce leakage currents of the order of 10 nanoamps which are amplified to of the order of 10 microamps. Such high leakage currents are due, in part, to the high gain needed for optically triggered devices and the need for a large area collector-base junction for light collection. In addition, it is desired to turn on the device when, for example, 40 microamps of current is generated in the phototransistor. What is required in such devices is a resistance of the order of megohms across the emitter-base junction of the phototransistor and a resistance of the order of kilohms across the output transistor. While several proposals exist for providing integral resistors of the order of a few kilohms in Darlington circuits (see, for example, U.S. Pat. No. 3,596,150 issued to Berthold, and U.S. Pat. No. 3,755,722 issued to Harland), there does not appear to be any practical method for providing integral resistors of higher orders of magnitude which are required for the type of high voltage devices described herein.

The invention is therefore directed to the problem of providing a high voltage monolithic transistor circuit with integral means for bleeding off leakage currents.

A further problem which is often encountered in such circuits results from the fact that the bonding pad to the emitter metallization of the output transistor is often placed over the area of the base of that transistor. If the insulation between the metal and the base region is not free from cracks, a short will develop. Consequently, a further feature of the invention in accordance with one embodiment is directed to eliminating this shorting problem.

SUMMARY OF THE INVENTION

These problems are solved in accordance with the invention. The transistor circuit includes input and output transistors which have distinct emitter regions of one conductivity type, distinct bases of opposite conductivity type, and a common collector of the one conductivity type. The base regions of the transistors are placed sufficiently close together so that their zero bias depletion regions overlap to produce a current therebetween sufficient to bleed off leakage current from the emitter-base junction of the input transistor when an external bias is supplied. Such an arrangement is equivalent to having a large resistance across the emitter-base junction of the input transistor. The resistor across the output transistor can be fabricated according to standard techniques. In accordance with a further embodiment of the invention, the bonding pad to the emitter of the output transistor is formed over a special isolated portion of the base region of the transistor to avoid shorting.

BRIEF DESCRIPTION OF THE DRAWING

These and other features of the invention are delineated in detail in the following description. In the drawing.

It will be appreciated that for purposes of illustration, these figures are not necessarily drawn to scale.

DETAILED DESCRIPTION

The invention will be described with reference to a Darlington transistor switch. It should be clear, however, that the invention can be utilized in any high voltage monolithic transistor circuit having at least two stages of amplification requiring a shunt resistance of large magnitude across at least one stage. In the context of this application a high voltage device is one which has a breakdown voltage of at least 50 volts. The invention is particularly advantageous for devices which operate at 200 volts and above.

Figure 1:
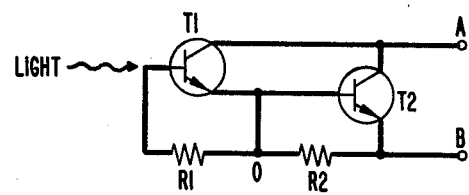
FIG. 1 is an electric circuit diagram of a Darlington circuit.

FIG. 1 illustrates a typical Darlington circuit employing an input transistor $T_1$ having its emitter coupled to the base of an output transistor $T_2$. The collector regions are interconnected to one terminal, A, of the circuit, while the emitter of $T_2$ is connected to the other terminal B. In this example, the input transistor $T_1$ is a phototransistor where the current through the base-emitter junction is generated due to the impingement of light.

Although the following discussion refers only to circuits with phototransistors as the input since the invention is most advantageous with respect to such devices, it should be clear that the invention is also applicable to standard transistors where an applied signal supplies the input, and leakage currents of a similar magnitude are generated.

As mentioned previously, leakage currents are generated across the collector-base junctions of the transistors. Resistors $R_1$ and $R_2$ are therefore supplied across the base-emitter junctions of transistors $T_1$ and $T_2$, respectively, in order to bleed off these currents. In accordance with one feature of the invention, a structure is provided for producing a very large value resistance for $R_1$ in order to bleed leakage currents of high voltage devices and still permit the device to turn on when the proper current is generated.

Figure 2:
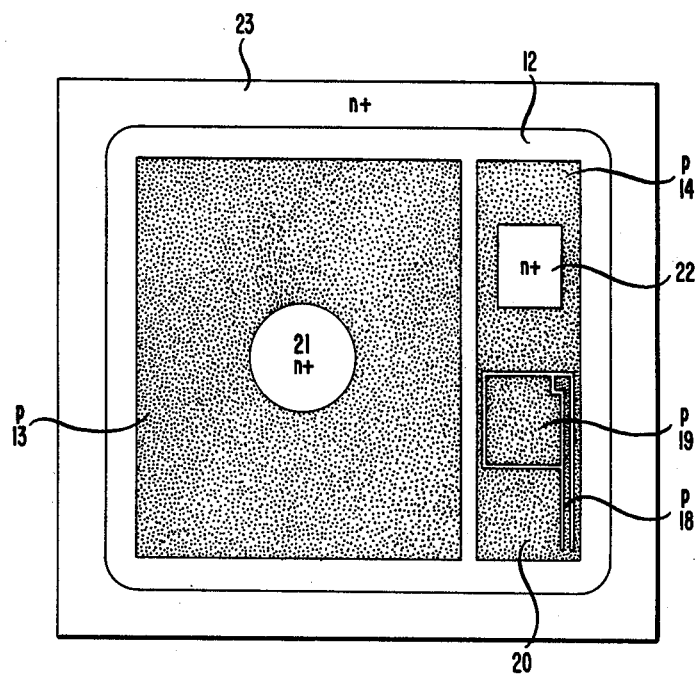
FIG. 2 is a plan view of a monolithic device in one stage of fabrication in accordance with one embodiment of the invention.
Figure 4:
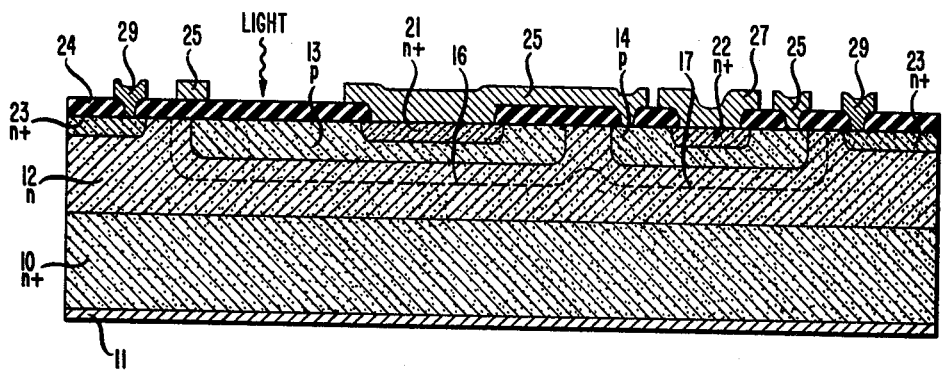
FIG. 4 is a cross-sectional view of the device of FIG. 3 taken along line 4—4'.
Figure 3:
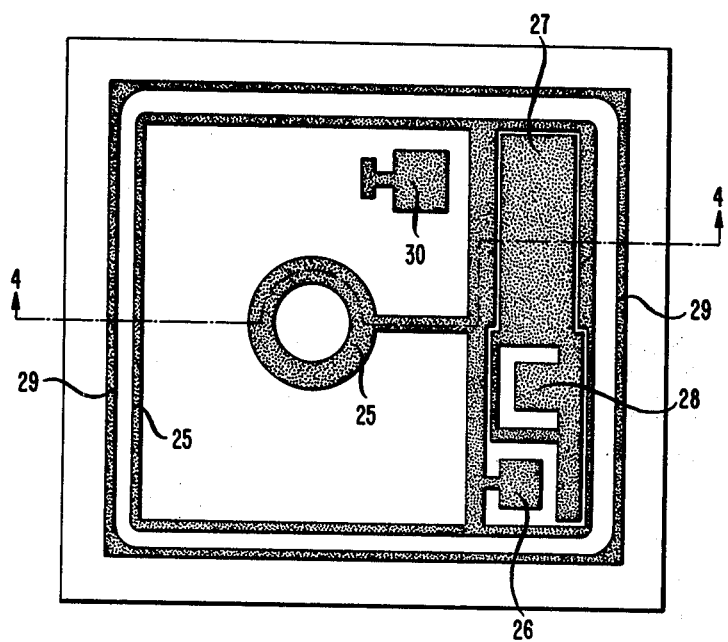
FIG. 3 is a plan view of the completed monolithic device in accordance with the same embodiment.

One embodiment of the present invention is illustrated in the plan views of FIGS. 2 and 3 and the cross-sectional view of FIG. 4. As best seen in FIG. 4, the devices were fabricated on a semiconductor wafer, 10, of n+ conductivity type which has formed thereon an epitaxial layer 12 of n conductivity type. The wafer is typically 5 cm in diameter and can accommodate many devices of the type described herein, which individually are typically 1500μ×1500μ. The layer and wafer, although distinct regions, may be considered as constituting the collector of the transistor, while layer 12 can be considered the common collector portion. A metal layer 11 provides contact to the collector. The wafer is typically doped with arsenic to give a concentration of typically $1 \times 10^{19}$ cm$^{-3}$. The doping of the layer 12, is an important consideration in the practice of the present invention. If the doping of this region is too high, the zero-bias depletion regions formed around the bases as the result of the built in voltage of the transistors will be too narrow to permit overlap when the bases are a reasonable distance apart. Consequently, it is recommended that the doping of layer 12 be such as to give a resistivity of at least 10 ohm-cm. For a 300 volt device, the resistivity is typically 20–50 ohm-cm. The thickness of layer 12 is typically approximately 40–60 microns. The thickness of layer 10 is typically approximately 8 mils in the final device.

Further reference is now made to FIG. 2, which is a plan view showing a composite of the various diffused regions formed in the semiconductor which make up the circuit elements. All diffusions may be formed using standard photolithographic masking techniques. In a first diffusion operation, p-type regions 13 and 14, which constitute the base regions of the input (photo) transistor and output transistor, respectively, were formed into region 12. For a 300 volt device, these regions are typically formed to a depth of approximately 5–25 microns. In this example, the regions were doped with boron to give a sheet resistance of approximately 200 Ω/□. Base region 13 measured approximately 940×1100μ and base region 14 measured approximately 300×1100μ. Both regions were formed to a depth of approximately 10μ. These values can be varied according to particular needs.

A key feature of the invention is the spacing between the two base regions 13 and 14. The built-in potential of the transistor, which is approximately 0.7 volts, produces depletion regions 16 and 17 surrounding said regions at zero external bias. In accordance with one feature of the invention, the base regions are placed sufficiently close together so that these zero bias depletion regions overlap to produce a punch-through condition. Such a condition results in a current flow between the bases when the external bias is supplied which is equivalent to having a resistor ($R_1$ of FIG. 1) of large magnitude across the emitter-base junction of the input transistor. Achieving a punch-through condition between two regions at the operating potential is known (see, e.g., U.S. Pat. No. 4,071,852 issued to Kannam and U.S. Pat. No. 4,078,244 issued to Bonis). However, it does not appear that anyone has previously recognized the advantage of overlapping the depletion regions at zero external bias, nor in particular that such could be used to form a large magnitude resistor for bleeding off leakage currents.

The bases of such devices in the prior art are normally approximately 20 microns apart and no punch-through is produced. However, in this example, the bases were placed approximately 2 microns apart along their common boundary. Thus, for a 300 volt device with a collector resistivity of 40 ohm-cm, the effective resistance produced across the emitter-base junction was approximately 12 megohms.

The value of the shunt resistance, $R_1$, which is chosen will depend upon several factors. In this example, the current needed to turn on the input transistor is desirably approximately 40 microamps and the resistance must be sufficiently high so as not to shunt this current. On the other hand, the voltage needed across the emitter-base junction is approximately 0.7 volts to turn on the phototransistor, and consequently the shunt resistance must not be so high that the product of the resistance and the leakage current, typically 1 nanoamp-1 microamp, will produce this voltage. With these constraints in mind, the value of the shunt resistance is desirably in the range 0.1–20 megohms.

The necessary spacing between the base regions for producing the desired resistance can be determined from the following equation:

$$J = \frac{9\epsilon_s\epsilon_o\mu_p}{8x^3}\left(V_{ap} - 0.66(\frac{x}{2w})^2\right)^2 \quad (1)$$

where J is the leakage current density between the base regions, x is the spacing, w is the zero bias depletion width, $V_{ap}$ is the voltage across the emitter-base junction of the input transistor, $\epsilon_s$ is the dielectric constant of silicon (11.7), $\epsilon_o$ is the permittivity of free space ($8.86\times10^{-14}$ F/cm), and $\mu_p$ is the mobility of holes in the collector region (500 cm$^2$/Vsec). The depletion region depth, w, is calculated, as well-known in the art, from the equation $$W = \sqrt{2\epsilon_s V_{bi} \epsilon_o / qN_b} \quad (2)$$

where $V_{bi}$ is the built-in voltage (0.7–0.85 V for Si), q is the magnitude of the electronic charge, and $N_B$ is the doping concentration of the epitaxial layer (12).

It will be appreciated that the depletion regions do not have to overlap along the entire common boundary of the bases. Rather, in accordance with an alternative embodiment, a tab portion may be provided extending from one of the bases and in sufficient proximity to the other base to result in overlap of the depletion regions only at that portion.

For high voltage devices in general, it is required to provide a spacing of 1–5μ between the bases in order to shunt leakage circuits of 1.0 nanoamp-1.0 microamp and produce effective resistances of 0.1–20 megohms. For impedances below this value, standard resistors can be fabricated, while for impedances above this range, sufficient leakage current will not be shunted.

An additional constraint in forming the base regions is that the depth desirably is larger than the spacing between the regions by at least a factor of five. Thus, in this example, where the spacing was 2μ, the depth was 10μ. This depth is desirable to avoid a back bias effect from the collector potential that reduces the amount of punch-through current flowing between the bases. Thus, a sufficient base depth will shield the gap from this effect.

At the same time as the base regions are formed, a standard resistor strip, 18, is formed in portion 12 and coupled to the base region, 14, of the output transistor. This resistor corresponds to $R_2$ of FIG. 2. This standard type of resistor can be utilized since an impedance of the order of only a few kilohms is required to shunt the output transistor. In this example, the resistor was doped with boron to obtain a sheet resistance of 200 Ω/□ and was approximately 600μ long, 14μ wide and 5–25μ deep in order to produce a resistance of approximately 9 kilohms. Also formed by the same diffusion is site 20 which is a portion of region 14 and is the electrical equivalent of point 0 in FIG. 1.

In accordance with a further feature of the invention, site 19 was also formed during the diffusion of the base. This is the site over which output terminal B of FIG. 1 will be formed after appropriate insulation (24) and metallization (27) are formed. It will be noted that the site 19 is electrically isolated from the remainder of the base region. Thus, if any cracks develop in the insulator beneath the bonding pad (28 of FIG. 3), there will be no short between the pad and the base region 14 of the output transistor.

In the next diffusion operation, emitter regions 21 and 22 of the input transistor and output transistor, respectively, were formed. These regions which are approximately 0.1 mm² in area in this example were doped with phosphorus to obtain a sheet resistance of approximately 4 Ω/□ and extend approximately 3–23μ into the surface of the semiconductor typically achieving base widths of 1–4 μm. At the same time, an n+ guard ring, 23, can be formed around the periphery of the device to prevent inversion of the surface at the boundaries of the collector region 12.

Next, a new insulating layer 24, was formed, and windows opened therein to allow contact to the various semiconductor regions. (Alternatively, the oxide mask used in the diffusion operations can be re-formed and new windows opened). Then, the metallization layer as shown in FIGS. 3 and 4 was deposited. Contact metal, 25, makes contact to emitter, 21, of the input transistor in an annular configuration and extends over the base, 14, of the output transistor to make contact thereto. A portion of said metallization also extends over site 20 (FIG. 2) to form contact pad 26 for testing purposes, and a further portion extends around the periphery of base regions 13 and 14 to serve as a field plate in order to prevent a large voltage build-up across the insulator at the edge of the base-collector junction. One of the advantages provided by the field plates and punch-through resistor is that the device is entirely planar. Metallization, 27, makes contact to the emitter region, 22, of the output transistor and extends to make contact to the top portion of the resistor strip, 18, of FIG. 2. Also formed by said metallization is contact pad 28 which constitutes the output terminal (B of FIG. 1) for the device. An annular metal contact 29 is also provided overlying the inner periphery of the n+ guard ring 23 and making contact thereto in order to prevent a large voltage drop across the insulator at the edge of the guard ring.

A contact pad 30 was also formed in order to make contact to the base 13 of the input transistor. In this example, such a contact pad is utilized for testing purposes. However, in cases of the normal biased transistor, this pad can be used as the input terminal of the Darlington circuit.

It will be appreciated that several modifications of the device can be made. Although n-p-n transistors are shown, p-n-p transistors may be utilized in which case all polarities shown would be reversed. In addition, certain features may be added, such as p+ guard rings around the emitter regions, for improved device performance. A plurality of insulating layers, such as a combination of silicon dioxide and silicon nitride may be employed on the device surface. As known in the art, the emitter and base regions may be formed by means other than diffusion, such as ion implantation.

Various additional modifications will become apparent to those skilled in the art. All such variations which basically rely on the teachings through which the invention has advanced the art are properly considered within the spirit and scope of the invention.

We claim:

1. A transistor circuit comprising an input transistor ($T_1$) and output transistor ($T_2$) having distinct emitter regions (21 and 22) of one conductivity type, distinct bases (13 and 14) of opposite conductivity type and a common collector portion (12) of said one conductivity type CHARACTERIZED IN THAT at least portions of said base regions are placed sufficiently close together so that the zero bias depletion regions of said base regions overlap to produce a current therebetween sufficient to bleed off leakage current from the emitter-base junction of the input transistor when an external bias is supplied.

2. The circuit according to claim 1 wherein the input transistor is a phototransistor.

3. The circuit according to claim 1 wherein the effective resistance produced across the emitter-base junction of the input transistor lies within the range 0.1–20 megohms.

4. The circuit according to claim 1 wherein the resistivity of the common collector region is at least 10 ohm-cm.

5. The circuit according to claim 1 wherein the said portions of the base regions are placed 1–5μ apart.

6. The circuit according to claim 1 wherein the breakdown voltage of the transistors is at least 50 volts.

7. The circuit according to claim 1 wherein the emitter of the input transistor is coupled to the base of the output transistor so as to form a Darlington transistor switch.

8. The circuit according to claim 1 wherein the base region of the input transistor comprises a tab portion extending from the main body of the base which is placed close to the body of the base of the output transistor.

9. The circuit according to claim 1 wherein the bases are placed sufficiently close together for overlap of the zero bias depletion regions along the entirety of their facing boundaries.

10. The circuit according to claim 1 further comprising a region (19) of said opposite conductivity type formed within the boundaries of the base region of the output transistor but electrically isolated therefrom over which is formed a bonding pad (28) constituting the output terminal of the circuit.

11. A planar monolithic Darlington transistor circuit having a breakdown voltage of at least 200 volts comprising a phototransistor ($T_1$) and an output transistor ($T_2$) having distinct emitter regions (21 and 22) of one conductivity type, distinct bases (13 and 14) of opposite conductivity type and a common collector portion (12) of said one conductivity type having a resistivity of 10–50 ohm-cm, wherein leakage currents of 1 nanoamp-1 microamp are generated in the collector-base junction of the phototransistor, CHARACTERIZED IN THAT the entire facing sides of said base regions are placed 1–5$\mu$ apart so that the zero bias depletion regions of said base regions overlap to produce a current therebetween when an external bias is supplied thereby providing an effective resistance across the emitter-base junction of the phototransistor of 0.1–20 megohms for bleeding off said leakage current from the emitter-base junction of the phototransistor.

12. The circuit according to claim 11 further comprising a region (19) of said opposite conductivity type formed within the boundaries of the base region (14) of the output transistor and electrically isolated therefrom and a bonding pad (28) constituting the output terminal formed over said region and insulated from said region.

* * * * *